US011442085B2

(12) United States Patent
Giere et al.

(10) Patent No.: US 11,442,085 B2
(45) Date of Patent: Sep. 13, 2022

(54) METHOD AND SYSTEM FOR MONITORING THE OPERATING STATE OF AN ENERGY SUPPLY NETWORK

(71) Applicant: Siemens Energy Global GmbH Co. & KG, Munich (DE)

(72) Inventors: Stefan Giere, Brandenburg (DE); Matthias Heinecke, Berlin (DE); Robert Knuth, Berlin (DE); Thomas Koch, Brieselang (DE); Puneet Harminder Singh, Nuremberg (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 17/599,013

(22) PCT Filed: Feb. 28, 2020

(86) PCT No.: PCT/EP2020/055282
§ 371 (c)(1),
(2) Date: Sep. 28, 2021

(87) PCT Pub. No.: WO2020/193074
PCT Pub. Date: Oct. 1, 2020

(65) Prior Publication Data
US 2022/0043040 A1 Feb. 10, 2022

(30) Foreign Application Priority Data
Mar. 28, 2019 (DE) .................... 10 2019 204 301.1

(51) Int. Cl.
*G06F 15/173* (2006.01)
*G01R 19/25* (2006.01)
(Continued)

(52) U.S. Cl.
CPC .......... *G01R 19/2513* (2013.01); *H04L 43/08* (2013.01); *H04L 67/12* (2013.01)

(58) Field of Classification Search
None
See application file for complete search history.

(56) References Cited

U.S. PATENT DOCUMENTS 8,417,391 B1 * 4/2013 Rombouts .............. G05B 13/02
700/297
10,719,062 B2 7/2020 Froehner et al.
(Continued)

FOREIGN PATENT DOCUMENTS

DE 102005046555 A1 4/2007
DE 202018102060 U1 7/2018
(Continued)

OTHER PUBLICATIONS

Dipl.-Ing. H. Horstmann GmbH: Product Catalog 2019, Oct. 15, 2018. Heiligenhaus, 2018.—Company Publication.

*Primary Examiner* — Phuoc H Nguyen
(74) *Attorney, Agent, or Firm* — Laurence A. Greenberg; Werner H. Stemer; Ralph E. Locher

(57) ABSTRACT

A method for monitoring an operating state of an energy supply network connects a data processing cloud to selected communication units at a query time over long-range communication connections. Selected communication units transmit measured values and/or values derived therefrom to the data processing cloud over a long-range connection. To receive measured values and/or values derived therefrom, each communication unit is connected, over a short-range communication connection, to at least one sensor on or in a high-voltage device of the network for capturing measured values. The data processing cloud determines the network operating state within an analysis based on measured values and/or values derived therefrom. To provide a simple and
(Continued)

cost-effective analysis of the entire network operating state, the data processing cloud during analysis uses measured values and/or values derived therefrom from at least two selected communication units at different locations.

14 Claims, 1 Drawing Sheet

(51) Int. Cl.
*H04L 43/08* (2022.01)
*H04L 67/12* (2022.01)

(56) References Cited

U.S. PATENT DOCUMENTS

| | | |
|---|---|---|
| 11,029,825 B2 | 6/2021 | Haupt et al. |
| 2010/0013632 A1 | 1/2010 | Salewske et al. |
| 2017/0145925 A1 | 5/2017 | Kusumi et al. |
| 2020/0133257 A1* | 4/2020 | Cella .................. G05B 13/028 |

FOREIGN PATENT DOCUMENTS

| | | |
|---|---|---|
| EP | 2293164 A1 | 3/2011 |
| EP | 3301774 A1 | 4/2018 |
| EP | 3301786 A1 | 4/2018 |
| WO | WO 2016023585 A1 | 2/2016 |

* cited by examiner

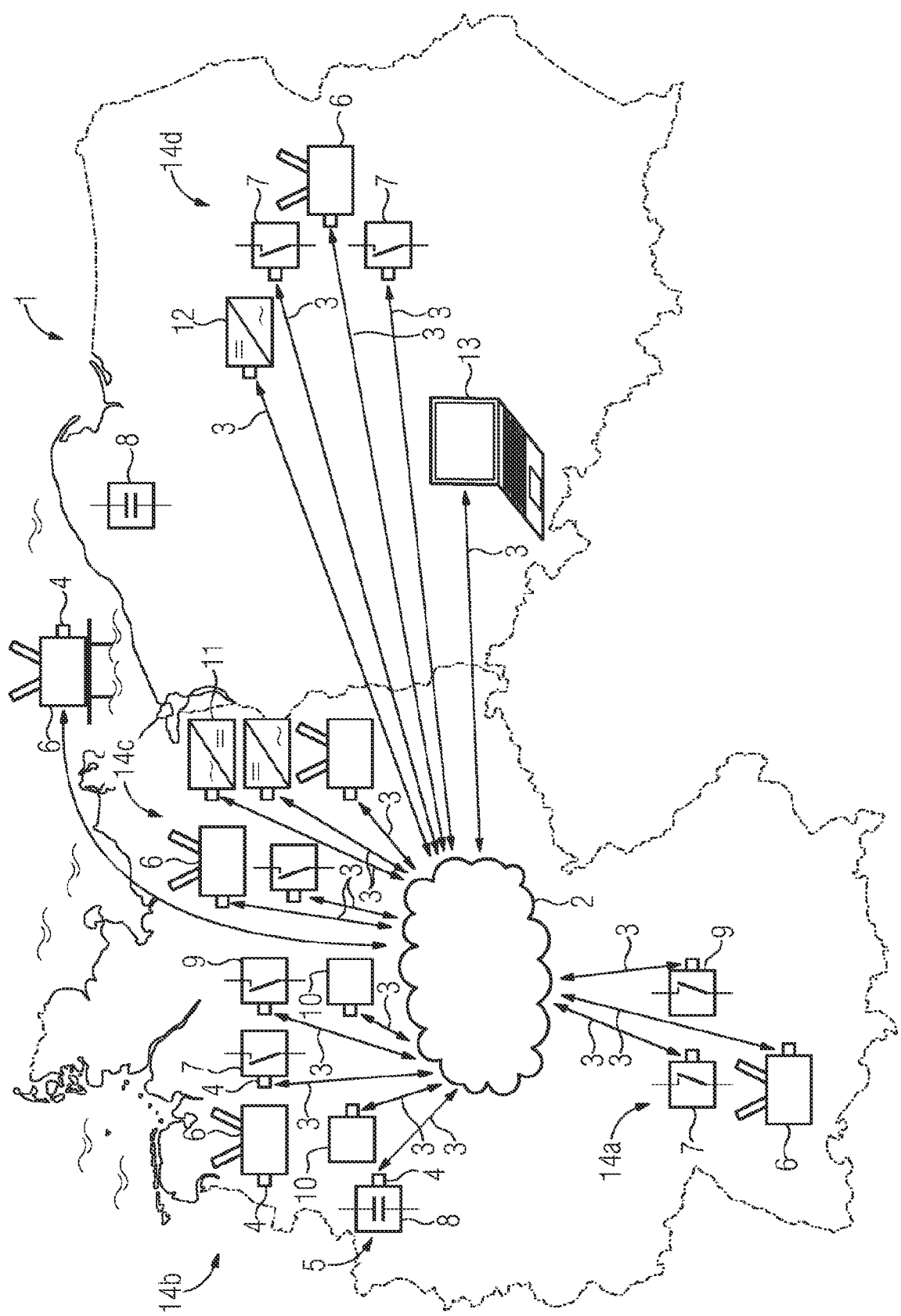

METHOD AND SYSTEM FOR MONITORING THE OPERATING STATE OF AN ENERGY SUPPLY NETWORK

FIELD AND BACKGROUND OF THE INVENTION

The invention relates to a method for monitoring the operating state of an energy supply network, wherein a data processing cloud is connected to a number of selected communication units via long-range communication connections at an interrogation time, each selected communication unit transmits measured values and/or values derived from the measured values to the data processing cloud via one of the long-range communication connections, wherein, in order to obtain the measured values and/or the values derived therefrom, each communication unit is connected via a short-range communication connection to at least one sensor which, in order to acquire the measured values, is arranged on or in a high-voltage device of the energy supply network, the data processing cloud determines the operating state of the energy supply network in the context of an analysis on the basis of the measured values and/or the values derived from the measured values.

Such a method is known from WO 2016/023585 A1, which describes a method by which the operating state of an energy supply network can be monitored. For this purpose, sensors are arranged at specific measuring points of the energy supply network, which sensors detect the voltage or the current flowing via the measuring points and thereby obtain measured values and transmit the measured values to an observation device. The observation device subsequently generates a visualization based on the measured values or on values derived therefrom. Furthermore, provision is made of an application server lying outside the sphere of influence of the operator of the energy supply network. The measured values can be evaluated and/or processed with the aid of the application server, system status values being formed which indicate the operating state of the energy supply network at the measuring points. The system status values are communicated to the observation device by the application server, the observation device taking into account and displaying the system status values in the visualization.

DE 20 2018 102 060 U1 discloses equipping transformers with communication units which are connectable to sensors on the input side and to a data processing cloud on the output side, such that statements about the operating status of the transformer are possible with the aid of the data processing cloud.

The method mentioned in the introduction is associated with the disadvantage that the operating state of the energy supply network can be determined only inadequately.

SUMMARY OF THE INVENTION

It is therefore an object of the invention to provide a method of the type mentioned in the introduction which enables a simple and cost-effective analysis of the operating state of the entire energy supply network to be carried out.

The invention achieves this object by virtue of the fact that during the analysis the data processing cloud takes account of the measured values and/or the values derived from the measured values which originate from at least two selected communication units installed at different locations.

According to the invention, the data to be analyzed, that is to say the measured values and/or the values derived therefrom, originate from high-voltage devices installed at different locations. In this case, according to the invention, any desired combinations of data can be carried out if this appears to be expedient at the respective time. The invention is based on the concept that the state of the energy supply network can be acquired satisfactorily only if the state of high-voltage devices at different locations is also known. In the context of the invention, an increase in the state knowledge is ensured during the monitoring of the energy supply network. The availability of the numerous individual measurements enables the measured values of all the high-voltage devices to be intelligently linked. Operating reserves of the HV devices can be fully utilized for the first time by means of the combination according to the invention. Moreover, the transparency of the transmission system to the network operator is increased and makes effective and thus cost-effective fleet management possible for the first time.

In the context of the invention, it is advantageous if the measured values originate from different high-voltage devices. In this regard, for example, the measured values and/or values derived therefrom which originate from a transformer and a high-voltage circuit breaker and a capacitor are taken into account in the context of the invention. In this further development of the invention, therefore, the data originate not only from different locations, but also from different high-voltage devices. Any desired combinations of locations and high-voltage devices can thus be carried out in the context of the invention. In this regard, for example, the measurement of the response time at the high-voltage circuit breaker in combination with the current value of the measuring transducer can serve to determine the loading of the contact pieces of the circuit breaker. From the loading of the contact pieces, finally, a conclusion can be drawn about when the next maintenance must become due or the circuit breaker must be exchanged. In the context of the invention, this is effected by way of measurements on a different circuit breaker at a different location. On the basis of this combination of the measured values and/or the derived values, the operating state of the energy supply network can be determined more accurately and even more reliably.

In the context of the invention, a user can log on at the data processing cloud with the aid of access data or, in other words, log-in data. On the basis of the user data, the data processing cloud recognizes which high-voltage devices and/or which communication units are relevant to the user. For this purpose, the data processing cloud has an expedient database stored on a memory of the data processing cloud. If the user is an operator of a specific energy supply network, for example, the data processing cloud recognizes for example that the user operates ten transformers, twenty circuit breakers, ten operating switches, five arresters and three capacitor banks. Each of these high-voltage devices has sensors connected to at least one communication unit. It is only these communication units, referred to hereinafter as selected communication units, which the data processing cloud contacts in the context of the invention.

The connection is effected via a long-range communication connection. In order to establish the latter, the communication unit has a long-range communication device, such as a mobile radio module according to the GPRS or UMTS standard, for example. A long-range communication connection, preferably an IP-based data connection, to the data processing cloud is set up by means of said module. In this case, for example, a mobile radio service provider or a telecommunications provider can be interposed and the long-range communication connection can be established at least partly via a communication network of said provider and/or at least partly via the internet. Establishing the connection then incurs only a very low outlay in respect of configuration and/or parameterization. Apart from the configuration of the long-range communication device with the information required for setting up the long-range communication connection, e.g. the incorporation of a SIM card of a telecommunications provider, no further outlay need be expended for the individual communication unit.

By contrast, in the context of the invention, the sensors are connected to the communication unit via a short-range communication connection. The short-range communication connection can be a simple cable for example. In a departure therefrom, the short-range communication connection is for example a ZigBee, Bluetooth, Wireless, Ambus or WiFi communication connection. The short-range communication connection extends over a maximum of 100 meters.

An electric energy supply network serves for the transmission and distribution of electrical energy from the generator through to the end consumer. An important task of an energy supply network is to protect and approve the reliability of the supply of electrical energy to the end consumer. It is therefore in the interest of the energy supplier to reduce possible outages of the supply of electrical energy, for example owing to short circuits or ground faults. Before a fault that occurs in an energy supply network can be rectified, the operator of the energy supply network must first recognize that there is actually a fault in the energy supply network. Furthermore, it is helpful if the operator is already advised of a possible fault source before the failure of a high-voltage device. The operator is supported in this by the invention.

A data processing cloud should be understood here to mean an arrangement comprising one or more data storage devices and one or more data processing devices, which arrangement can be designed to carry out any desired data processing processes by way of suitable programming. In this case, the data processing devices generally constitute universal data processing devices, such as servers, for example, which initially have no specified design at all with regard to their construction and their programming. The universal data processing device can be upgraded to perform specific functions only by means of programming which is carried out.

Insofar as the data processing cloud has a plurality of individual components, the latter are connected to one another in a suitable manner for data communication, for example by means of a communication network. Any desired data can be fed to a data processing cloud for data storage and/or processing. The data processing cloud itself in turn provides other devices, for example computer workstations, laptops, smartphones connected to a data processing cloud, with the stored data and/or the events of the data processing carried out. A data processing cloud can be provided for example by one computing center or else a plurality of networked computing centers. A data processing cloud is usually embodied spatially at a distance from the high-voltage devices.

The communication unit preferably has at least one analog input and at least one digital input. A plurality of sensors can thus be connected to a communication unit. The communication unit has for example a main processor and an auxiliary processor and a storage unit, in which preprocessed measured values or values derived therefrom can be stored and processed, e.g. by means of averaging. The measured values from different sensors can therefore be transmitted jointly from a communication unit to the data processing cloud via a long-range communication connection.

The sensors can be for example ammeters, voltmeters, temperature meters, manometers, status indicators of switches (open, closed, fault) or states of fuses (intact, tripped). In the context of the invention, the sensors can also acquire pressures, viscosities of a medium or status reports of valve states. In the context of the invention, it is also possible to use gas sensors which detect for example partial pressures of a specific gas. Optical sensors for detecting arcs are also possible in the context of the invention.

The access data are for example customary log-in data. In this regard, the access data consist for example of a user name and a password individually assigned to the user name.

The data processing cloud expediently has a database which can be used to determine which high-voltage devices are assigned to the respective user of the data processing cloud.

The database stores further data which enable a connection between the data processing cloud and the selected communication units.

Advantageously, measured values and/or values derived from the measured values which originate from different high-voltage devices influence the analysis. This combination of data during the analysis affords further possibilities of improving the analysis with regard to its accuracy and meaningfulness regarding the operating state of the energy supply network.

A high-voltage device in the context of the invention is designed for operation in the high-voltage network, i.e. for an operating voltage of between 1 kV and 1000 kV, I particular 50 kV and 800 kV. The high-voltage network is preferably an AC voltage network. However, a DC voltage network and/or a combination of AC and DC voltage networks are also possible in the context of the invention.

According to the invention, a high-voltage device is for example a transformer, in particular a power transformer, a circuit breaker, a load disconnecting switch, a disconnecting switch, a capacitor bank, an arrestor, a high-voltage bushing, a converter, a matrix switch, a DC voltage switch or the like.

An analysis in the context of the invention can be configured in any desired way, in principle. In this regard, an analysis can comprise a visualization, for example, which illustrates the operating state of the energy supply network.

In a further variant of the invention, measured values and/or values derived from the measured values which originate from measuring points of different locations influence the analysis. Measuring point here is understood to mean that location of a sensor which is not arranged on a high-voltage device, but rather directly on a high-voltage line. This sensor arranged at a measuring point is a current or voltage converter, for example, which detects the current flowing via the measuring point and obtains current values or, respectively, detects the voltage dropped across the measuring point and obtains voltage values. A value derived from these measured values is understood to mean for example the power derived from these measured values, which power can be broken down as necessary into active power and reactive power.

In accordance with a further variant of the invention, dynamic processes are simulated in the context of the analysis. The analysis can simulate for example the future development of the operating state of the respective high-voltage device. Such simulations are known in principle to the person skilled in the art. According to the invention, however, high-voltage devices at different locations can be simulated and related to one another. The behavior of the energy supply network can be predicted even better as a result.

In one preferred variant of the invention, the analysis is effected with the aid of at least one algorithm which simulates an intelligent behavior. Such an intelligent behavior is also referred to as artificial intelligence. The combination of data that is the most appropriate for observing the energy supply network can be determined and carried out with the aid of the artificial intelligence.

Advantageously, measured values and/or values derived from the measured values which were acquired and/or derived, respectively, before the interrogation time are used during the analysis.

So-called dynamic effects can be taken into account and made visible with the aid of measured values or derived values from the past. If for example the temperature of an insulating fluid of a transformer as a high-voltage device does not increase continuously, but rather abruptly, for example from one minute to the next, then this is certainly an indication of a fault that should be rectified as soon as possible.

In order to be able to access the measured values and/or values derived therefrom which precede the interrogation time, at least one storage unit is required. In the context of one further development of the invention, said storage unit is provided in the communication unit, for example. In accordance with this variant of the invention, it is not necessary to permanently maintain a long-range communication connection between the communication unit and the data processing cloud. In the context of this further development, the measured values and/or values derived therefrom can be stored locally. The values stored locally are then transmitted to the data processing cloud during the next connection thereto. Before the local storage, in the context of the invention, the measured values and/or values derived therefrom can be averaged or preprocessed in some other way.

In a further variant of the invention, measured values acquired before the interrogation time and/or values derived therefrom are stored on a memory of the data processing cloud. In accordance with this advantageous further development, either only the data processing cloud or the data processing cloud in addition to the communication units has a storage unit. This central storage unit is used to store the measured values and/or values derived therefrom, e.g. after a long-range communication connection has been established between the communication unit and the data processing cloud by the user at the interrogation time. In a departure from this, the data processing cloud can connect to each communication unit at fixed intervals in order to access locally stored data and in order to store said data on the larger central storage unit. An overflow of the local memories of the communication units is thus avoided.

In accordance with a further variant of the invention, there is continuously a long-range communication connection between the communication units and the data processing cloud, with the result that the measured values and/or values derived therefrom are continuously transmitted to the storage unit of the data processing cloud and are stored there in order to be able to be represented in a time-resolved manner at the interrogation time with other data, values or information.

In accordance with one preferred further development of the invention, the visualization is generated with the aid of a quotient of the load current to the rated current relative to the respective high-voltage device. In this case, the load current is the current which is actually detected by the sensors and flows through a high-voltage winding or via a high-voltage switch, for example. The rated current is the current which is intended to flow via the respective high-voltage device. In other words, the rated current is a predefined parameter. If the quotient of the load current to the rated current exceeds a threshold value, for example 1.5, the visualization can illustrate this with the aid of a specific color of the high-voltage device. If the high-voltage device is a transformer, for example, then the latter is illustrated for example highly schematically with its housing and its bushings. If the quotient of the load current to the rated current is 1, the transformer is green. If the quotient exceeds 2, however, a red representation of the transformer is selected, which is intended to indicate the critical state of the transformer. Furthermore, if the threshold value, for example 2, is exceeded, a warning signal can be transmitted from the data processing cloud to the user.

The data processing cloud advantageously recognizes such an instance of a limit value being exceeded even when the user is not connected to the data processing cloud. In this case, for example, the data processing cloud can communicate a warning SMS, email or some other signal to a cellular phone or else to a monitoring station.

In accordance with a further advantageous configuration of the method according to the invention, measured values and/or values derived therefrom which temporally precede the interrogation time are represented in a diagram in a manner correlated with data which are not derived from the measured values of the sensors. These data are for example temperature values which have been obtained from a weather service connected to the internet. Furthermore, wind strengths, insolation values or other influencing variables of the status of the high-voltage devices can be taken into account. The measured values of other high-voltage devices can also be taken into account and represented over time.

In accordance with one preferred variant of the invention, a visualization is effected in the context of the analysis, a map being represented during said visualization, the high-voltage devices connected to the selected communication units being illustrated schematically on said map. As already indicated further above, a transformer, for example, can be represented in the visualization in a simplified manner by means of a symbol. The same correspondingly applies to a circuit breaker, a disconnecting switch, a capacitor bank, surge arresters or other high-voltage devices.

If the user for example is an operator of an energy supply network and is responsible for a number of transformers, circuit breakers, capacitor banks, spark gaps or the like, said user's high-voltage devices are jointly represented geographically on the map. The user thus obtains a good overview of the high-voltage devices for which the user is responsible.

Advantageously, on the basis of the measured values acquired before the interrogation time and/or values derived therefrom, a prediction about the further course of the capacity utilization and the lifetime of the high-voltage devices is generated, this likewise being represented schematically in the visualization. If, for example, the occurrence of an arc in a transformer tank or a circuit breaker is monitored with the aid of a camera, a prediction of the length of time for which maintenance of the respectively monitored high-voltage device can still be deferred or when exactly this maintenance should take place can be made with the aid of the detected arcs and a simple extrapolation or a more complex simulation.

This prediction takes into account both measured values or values derived therefrom which precede the interrogation time and measured values which are acquired approximately at the interrogation time and/or during a session of the user in the cloud.

Taking account of measured values in the past increases the accuracy of the prediction.

Advantageously, by means of a position determining antenna arranged in a communication unit, the geographical position of the respective communication unit and of the high-voltage device connected thereto is determined and the weather conditions are determined by a weather news service on the basis of the geographical data. In accordance with this advantageous further development, the weather conditions need not be acquired in situ in a complicated manner. Rather, in the context of the invention, it is possible to have recourse to data which are available anyway—e.g. on the internet. The data relating to the weather conditions obtained in this way can likewise be shown in the visualization.

Advantageously, each communication unit is equipped with a position determining antenna.

The following description of exemplary embodiments of the invention with reference to the FIGURE of the drawing relates to further expedient configurations and advantages of the invention, wherein identical reference signs refer to identically acting components.

BRIEF DESCRIPTION OF THE FIGURE

The FIGURE schematically illustrates an exemplary embodiment of the method according to the invention.

DETAILED DESCRIPTION OF THE INVENTION

The FIGURE shows an exemplary embodiment of the method 1 according to the invention, wherein a data processing cloud 2 is discernable, which is connected via a long-range communication connection 3 in each case to a communication unit 4 secured to a high-voltage device 5. In the exemplary embodiment illustrated, the high-voltage devices 5 are transformers 6, which are shown schematically with their column-like bushings, high-voltage circuit breakers 7, capacitor banks 8, high-voltage disconnecting switches 9, high-voltage arresters 10, a rectifier 11 and also an inverter 12. A user unit in the form of a laptop 13 is furthermore discernable, with the aid of which laptop a user can transmit access data, i.e. so-called log-in data, to the data processing cloud 2 via a long-range communication connection 3. In the exemplary embodiment shown, the access data comprise a user name and a password permanently assigned to the user name.

The data processing cloud 2 furthermore has a storage unit, which is not illustrated in the FIGURE and stores a database. The database stipulates which high-voltage devices 5 are assigned to the access data, that is to say to the user name in this case. If the user is for example the operator of an energy supply network having a number of high-voltage devices in the form of transformers 6, disconnecting switches 9, circuit breakers 7, arresters 10, etc., the user, by means of inputting the latter's access data in the data processing cloud 2, can connect to the communication units 4 which are secured in the vicinity or—as shown in the FIGURE—to the respective high-voltage device 5. The data processing cloud 2 thus accesses, via the long-range communication connection 3, the communication units 4 which are arranged in the vicinity of the high-voltage devices 5 assigned to the user name. These communication units 4 are referred to here as selected communication units 4. Each communication unit 4 has a plurality of inputs, which are both analog and digital, for example. At least one of the inputs is connected via a short-range communication connection, not illustrated in the FIGURE, to a sensor arranged on or in the associated high-voltage device 5 and configured for acquiring measured values, wherein the sensor transmits said measured values and/or values derived therefrom.

In the exemplary embodiment shown, a plurality of sensors, not illustrated in the FIGURE, are provided in each transformer 6. One sensor detects for example the temperature of an insulating fluid, here an ester oil, in the upper region of the tank of the transformer. A further sensor detects the temperature of the insulting fluid in the lower region of the tank, whereas a third sensor detects the currents flowing through the high-voltage winding.

In the exemplary embodiment illustrated, a plurality of sensors are provided for a high-voltage circuit breaker 7, too. One sensor detects e.g. the current which flows via the high-voltage circuit breaker when the contact of the latter is closed. Another sensor serves for ascertaining the switch position, in particular whether the contact pieces of the contact are bearing against one another or are separated from one another. A further sensor serves for detecting an arc occurring in the housing of the circuit breaker. Further sensors are arranged for example on a rectifier 11 configured for converting an AC voltage into a DC voltage. Sensors of said rectifier 11 detect for example the DC currents and DC voltages occurring on the DC voltage side of the rectifier 11. Other sensors detect the input currents and respectively input voltages occurring on the AC voltage side of the rectifier 11. Values derived from these measured values are the active and reactive powers occurring here. All the sensors transmit their measured values or the values derived therefrom to the communication unit 4 to which the respective sensors are connected via the respective short-range communication connection. Each communication unit has at least one expedient processor and a storage unit, which can buffer-store the acquired measured values or the values derived therefrom. The measured values are processed here by the communication unit 4 for example by means of expedient averaging over a certain time duration. The communication units 4 locally store the averaged values in their storage unit. In this regard, the measured values can be stored locally in the communication unit 4 for weeks, for example.

If the user uses the latter's laptop 13 or cellular phone to access the data processing cloud 2 at an interrogation time, the values stored in the respective communication unit 4 before this interrogation time are transmitted to the data processing cloud 2. The data processing cloud 2 stores the transmitted data centrally on its storage unit, not illustrated in the FIGURE. The values or, in other words, data stored there can then be subjected to an expedient analysis.

According to the invention, it is essential that measured values and/or values derived therefrom which originate from high-voltage devices installed at different locations are taken into account during the analysis. Four different locations 14a, 14b, 14c and 14d are illustrated by way of example in the FIGURE. In the exemplary embodiment shown, the locations 14a, 14b and 14c are located in the Federal Republic of Germany, whereas the location 14d is intended to schematically illustrate an installation location in Poland.

According to the invention, not just data of one location, e.g. 14a, are evaluated. Rather, a combination of, for example, sensor data of a circuit breaker 7 from the installation location 14b with the data of a transformer 6 from the installation location 14a occurs in the context of the invention. The data of the transformer 14d from the installation location 14d are taken into account at the same time. On account of this combination of data of varying spatial origin, the analysis of the operating state of the energy supply network can be significantly improved and a visualization can be represented on the basis of the analysis, for example, said visualization identifying critical states of the high-voltage devices 5 in color, for example. A simulation of the future operating state of the HV devices is also possible.

The FIGURE does not illustrate the transmission lines of the energy supply network with their measuring points, at which sensors are likewise arranged. These sensors, too, are connected to a communication unit via a short-range communication connection. The short-range communication connection is a simple cable in the exemplary embodiment discussed.

Each communication unit 4 furthermore has an antenna enabling the position of the communication unit 4 to be determined. The communication unit 4 is arranged in the vicinity of the respective high-voltage device 5, that is to say less than 100 m. In other words, by determining the position of the communication unit 4, it is also possible to acquire the geographical position of the respective high-voltage device 5. This is done by means of a position determining system such as, for example, GPS, Galileo or the like.

If the geographical position of the high-voltage device 5 has been determined, the data processing cloud 2 accesses weather data available for this location by virtue of the data processing cloud 2 accessing the database of a weather service in order to determine for example insolation, wind strength and outside temperature at the location of the respective high-voltage device 5.

The analysis according to the invention not only enables a representation of the operating state of the entire energy supply network including the high-voltage devices 5 provided therein, but furthermore also enables the simulation of dynamic processes. Intelligent algorithms, that is to say the use of artificial intelligence, can be used in this case.

The invention claimed is:

1. A method for monitoring an operating state of an energy supply network, the method comprising:
   connecting a data processing cloud to a number of selected communication units over long-range communication connections at an interrogation time;
   using each selected communication unit to transmit at least one of measured values or values derived from the measured values to the data processing cloud over one of the long-range communication connections;
   placing at least one sensor on or in a high-voltage device of the energy supply network to acquire the measured values, and connecting each communication unit over a short-range communication connection to the at least one sensor to obtain at least one of the measured values or the values derived from the measured values;
   using the data processing cloud to determine the operating state of the energy supply network in an analysis based on at least one of the measured values or the values derived from the measured values; and
   during the analysis, using the data processing cloud to take into account at least one of the measured values or the values derived from the measured values originating from at least two selected communication units installed at different locations.

2. The method according to claim 1, which further comprises using at least one of the measured values or the values derived from the measured values originating from different high-voltage devices, to influence the analysis.

3. The method according to claim 1, which further comprises using at least one of the measured values or the values derived from the measured values originating from measuring points of different locations, to influence the analysis.

4. The method according to claim 1, which further comprises simulating dynamic processes based on the analysis.

5. The method according to claim 1, which further comprises carrying out the analysis by using at least one algorithm simulating an intelligent behavior or artificial intelligence.

6. The method according to claim 1, which further comprises, during the analysis, using at least one of the measured values or the values derived from the measured values having been at least one of acquired or derived before an interrogation time.

7. The method according to claim 6, which further comprises storing at least one of the measured values acquired before the interrogation time or the values derived from the measured values acquired before the interrogation time, on a storage unit of the communication unit.

8. The method according to claim 6, which further comprises storing at least one of the measured values acquired before the interrogation time or the values derived from the measured values acquired before the interrogation time, on a memory of the data processing cloud.

9. The method according to claim 1, which further comprises using the data processing cloud to generate a visualization of the operating state of the energy supply network based on the analysis.

10. The method according to claim 9, which further comprises representing a map during the visualization, and schematically illustrating on the map the high-voltage devices connected to the selected communication units.

11. The method according to claim 1, which further comprises generating a prediction about a further course of a capacity utilization and lifetime of the high-voltage devices and representing the prediction in the visualization, based on at least one of the measured values acquired before an interrogation time or values derived from the measured values acquired before the interrogation time.

12. The method according to claim 1, which further comprises using a position determining antenna disposed in a communication unit to determine a geographical position of a respective communication unit and of the high-voltage device connected to the respective communication unit, and subsequently acquiring weather data provided for the geographical position of the high-voltage device from a service provider using a weather news service.

13. A non-transitory computer program product, comprising instructions stored thereon, that when executed on a processor, perform the steps of claim 1.

14. A non-transitory computer-readable medium storing a computer program according to claim 13.

* * * * *